(12) United States Patent
Sandström

(10) Patent No.: US 8,456,613 B2
(45) Date of Patent: Jun. 4, 2013

(54) METHOD AND APPARATUS FOR QUANTIFICATION OF ILLUMINATION NON-UNIFORMITY IN THE MASK PLANE OF A LITHOGRAPHIC EXPOSURE SYSTEM

(75) Inventor: Torbjörn Sandström, Pixbo (SE)

(73) Assignee: Micronic Laser Systems (SE)

( * ) Notice: Subject to any disclaimer, the term of this patent is extended or adjusted under 35 U.S.C. 154(b) by 1034 days.

(21) Appl. No.: 12/125,265

(22) Filed: May 22, 2008

(65) Prior Publication Data

US 2008/0316457 A1 Dec. 25, 2008

Related U.S. Application Data

(60) Provisional application No. 60/939,416, filed on May 22, 2007.

(51) Int. Cl.
*G03B 27/54* (2006.01)
*G03B 27/74* (2006.01)
(52) U.S. Cl.
USPC .............................................. 355/67; 355/68
(58) Field of Classification Search
USPC .................. 355/67, 68, 72, 75; 356/497, 512
See application file for complete search history.

(56) References Cited

U.S. PATENT DOCUMENTS

| | | | | |
|---|---|---|---|---|
| 5,317,582 | A * | 5/1994 | Siebert | 372/25 |
| 6,268,904 | B1 * | 7/2001 | Mori et al. | 355/53 |
| 2004/0008399 | A1 * | 1/2004 | Trisnadi | 359/279 |
| 2004/0174510 | A1 * | 9/2004 | Kataoka | 355/53 |
| 2005/0088663 | A1 * | 4/2005 | De Groot et al. | 356/497 |
| 2007/0258086 | A1 * | 11/2007 | Bleeker et al. | 356/237.4 |
| 2008/0087105 | A1 | 4/2008 | Renken et al. | |

FOREIGN PATENT DOCUMENTS

| | | |
|---|---|---|
| EP | 0 744 641 A2 | 11/1996 |
| JP | 05040240 | 2/1993 |

OTHER PUBLICATIONS

Abdo, A. et al. "Optical Mask Modeling Update—Experimental Model Verification of the Thermomechanical Response of Optical Reticles," Computational Mechanics Center Department of Mechanical Engineering, University of Wisconsin—Madison, Sep. 7, 2000.
Parker, Jeffrey and Wayne Renken, "In Situ Wafer and Photomask Temperature Metrology for CD Control in Deep UV Lithography," SensArray Corporation, 1997.
Rydberg, Christer et al, "Dynamic Laser Speckle as a Detrimental Phenomenon in Optical Projection Lithography," Journal of Microlithography, Microfabrication, and Microsystems, vol. 5, 0033004-1-8, 2006.
Shi, Xiaolei et al. "Design of a C aperture to achieve $\lambda/10$ resolution and resonant transmission," JOSA B, vol. 21, Issue 7, pp. 1305-1317, Jul. 2004.
Shi, Xiaolei et al. "A Nano-aperture with 1000x Power Throughput Enhancement for VSAL," Siros Technologies, Apr. 25, 2001.
International Search Report for Intl. Application No. PCT/EP2008/056331 mailed Sep. 19, 2008.

* cited by examiner

*Primary Examiner* — Peter B Kim
(74) *Attorney, Agent, or Firm* — Haynes Beffel & Wolfeld LLP; Ernest J. Beffel, Jr.

(57) ABSTRACT

This disclosure relates to lithography using pulsed laser illumination. In particular it relates to lithography for producing electronic devices on wafers using multi-mode excimer and molecular lasers, e.g. KrF, ArF, and F2 lasers. It may also apply to illumination systems where several single-mode sources are mixed or one single-mode laser beam is split and recombined with time delays, thereby creating an equivalent multimode source and to EUV lithography. Particular aspects of the present invention are described in the claims, specification and drawings.

29 Claims, 2 Drawing Sheets

US 8,456,613 B2

METHOD AND APPARATUS FOR QUANTIFICATION OF ILLUMINATION NON-UNIFORMITY IN THE MASK PLANE OF A LITHOGRAPHIC EXPOSURE SYSTEM

RELATED APPLICATION

This application is related to and claims the benefit of U.S. Provisional Patent Application No. 60/939,416 filed May 22, 2007. The related provisional application is hereby incorporated by reference. A related PCT case, with the same title and inventor as this application, was filed on May 22, 2008.

BACKGROUND OF THE INVENTION

This disclosure relates to lithography using pulsed laser illumination In particular it relates to lithography for producing electronic devices on wafers using multi-mode excimer and molecular lasers, e.g. KrF, ArF, and F2 lasers. It may also apply to illumination systems where several single-mode sources are mixed or one single-mode laser beam is split and recombined with time delays, thereby creating an equivalent multimode source. EUV sources do not give much speckle, but similar illumination micro-nonuniformities may be created by the illuminator optics and the invention may have utility also for EUV lithography.

The inventor and co-workers have shown that the coherent character of multi-mode laser light causes significant micro-nonuniformity ("speckle"), both static and dynamic, in the mask plane of an exposure system. The dynamic part comes from the light source and the static part may be created by the optics. Knowledge about actual levels of speckle and the understanding of their causes in real lithographic systems is still incomplete. The amount of non-uniformity affects the CD uniformity of the image and ultimately the yield of the production process. (Reference 1: Christer Rydberg, Jörgen Bengtsson and Tor Sandström, "Dynamic Laser Speckle as a Detrimental Phenomenon in Optical Projection Lithography," Journal of Microlithography, Microfabrication, and Microsystems, Vol 5, 033004-1-8, (2006)). Other sources of micro-nonuniformities in the mask plane are interference or incomplete mixing in the illuminator. These nonuniformities may have similar lateral spectra as the speckle described in Reference 1, but may be more difficult to average out by multiple pulses.

The level of speckle, and, generally, micro-nonuniformities may be influenced by design and operating conditions. The micrononuniformity can be made better by sacrificing the through-put, increasing the exposure dose, modifying the coherence, and reducing the degree of polarization. However, in order to make these trade-offs, a way to measure the actual amount of micrononuniformity is needed. Currently no such method exists. Makers of exposure equipment may be doing lab experiments, but there is no way for the users of the equipment to quantify the micro-nonuniformities in process illumination. In prior art, exposure systems have detectors for verifying the illumination uniformity, but these detectors typically measure the average light energy over many laser pulses, multiple scanning positions, and across a finite area. Above all, they do not have the lateral resolution needed to quantify the speckle-like micrononuniformities. In a system for printing 50 nm lines width there may be micro-nonuniformities with sizes below 100 nm in the wafer plane. Therefore, current detectors for illumination uniformity do not give a true image of the local micro-nonuniformity which has a spatial spectrum nearly as high as the printed pattern. It is the purpose of the current disclosure to describe methods and apparatuses for detecting and quantifying micro-nonuniformities in lithography, and make such measurements possible in a production setting with extreme requirements of cleanliness and little tolerance of side effects from the measurement.

SUMMARY OF THE INVENTION

This disclosure relates to lithography using pulsed laser illumination. In particular it relates to lithography for producing electronic devices on wafers using multi-mode excimer and molecular lasers, e.g. KrF, ArF, and F2 lasers. It may also apply to illumination systems where several single-mode sources are mixed or one single-mode laser beam is split and recombined with time delays, thereby creating an equivalent multimode source and to EUV lithography. Particular aspects of the present invention are described in the claims, specification and drawings.

DETAILED DESCRIPTION

Figure 1:
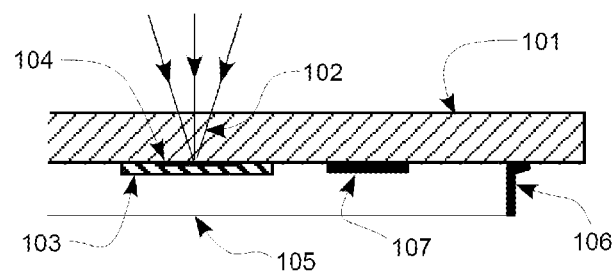
FIG. 1 shows part of an example embodiment of an apparatus for measuring the micro-nonuniformity in the mask plane of a stepper or scanner.

The following detailed description is made with reference to the figures. Preferred embodiments are described to illustrate the present invention, not to limit its scope, which is defined by the claims. Those of ordinary skill in the art will recognize a variety of equivalent variations on the description that follows.

A purpose of the technology disclosed is to provide a practical method to assess contributions from the illuminator to the exposure non-uniformity in the photosensitive surface (typically a photoresist) on the workpiece (typically a semiconductor wafer), by quantifying the micro-nonuniformity in the illuminating beam. Such a method may be practiced as follows.

A light detector is placed in the mask plane or in an image of the mask plane. The detector may have many (>1000) parallel channels each measuring the light energy from either a single laser pulse, or a small number of pulses e.g. 2, 4, 8, 16, 32, 64, etc. The lateral resolution, i.e. the sampling area of each detector channel, needs to be approximately the same as the smallest feature to be measured. This detector, which will be described later, measures the local energy, and the data from parallel detectors is stored in an electronic memory. The content of the memory is analyzed at a later time. The variation from channel to channel and between multiple recordings from the same channel is analyzed. The channels are calibrated by comparison of long-term averages and the detector noise is removed from the variance of the measurements. The pulse-to-pulse average energy is also removed from the variance. What remains is a measure of previously unmodeled micro-nonuniformity, and it can be converted to a contribution of CD non-uniformity in the produced devices (typically integrated circuits). Too much non-uniformity may lead to a slower device or even a non-functioning device. Alternative, less non-uniformity, giving tighter CD uniformity, leads to faster, more reliable chips and higher yield. Clues to the sources of illumination micro-nonuniformity can be deduced from further analysis of the data and comparison between a single pulse vs. multiple pulses, between a stationary or scanning slit, and between different illuminator settings in the exposure system. The fundamental speckle contribution can be calculated from first principles as shown in Reference 1. A second contribution is produced by interference in the illuminator optics and depends on the detailed design and quality of the optical components.

Integration into the Exposure System

When designing a new exposure system, such as a wafer scanner, it is possible to integrate a camera which projects a magnified portion of the mask plane and records images using a single flash (pulse), or a small number of flashes (pulses). The camera may be fixed or moveable and carried by the mask stage mechanics. In an example embodiment, it may even be possible to make said camera moveable so that different positions in the mask plane can be analyzed with the same camera. The micro-nonuniformities from in the illuminating beam are present in the mask (reticle) plane, but a nearly identical image of them is formed on the workpiece, and an alternative placement for the camera is in or behind the workpiece (e.g. wafer) plane, suitably carried by the stage mechanics. However, the mismatch between the size of the micro-nonuniformities and the pixel size of available cameras is larger in the wafer plane than in the mask plane due to the demagnification from the mask to the wafer in most exposure tools. Two alternative embodiments are a sparsely sampled detector with small apertures and a magnifying optical system as described in connection with a detector in the mask plane. Magnifying optics may suitably take the form of an inverted microscope, with a microscope (or microscope-like: small field, short focal length, high magnification) lens having the short conjugate facing the wafer plane, and the long conjugate towards an image sensor. If it is embedded in or attached to the workpiece stage, the stage can be used to position it in different locations in the image.

An alternative embodiment is to design the recording hardware in the form of a mask, make it operate autonomously, and allow it to be handled by the reticle handling system. By such a design, the system can be used with existing steppers and scanners with no rebuilding, and it can be used with new scanners with little impact on the design. Furthermore, a single metrology mask or metrology mask design may be used with multiple generations of scanners or scanners from different manufacturers, since the mask format has been standardized since more than 10 years. The device (the "metrology mask") is loaded from a SMIF pod or similar device into the exposure systems' internal reticle storage. Then it is called from the storage and placed in the reticle holder and a measurement script is executed. The data is stored in electronic memory on the device itself. After the measurement, the device is removed and sent out in a SMIF pod. The SMIF pod is opened at a service station and the data from the device is read out and it is reprogrammed for the next measurement.

In a slightly more elaborate scheme, the scanner or stepper has at least one position in the internal stocker where the device is permanently stored. In this position the batteries can be charged, and information and programming be read and written.

FIG. 1 shows the measuring hardware when designed for handling as a mask. The substrate 101 is identical in shape to a mask substrate, i.e. typically 152×152×6.25 mm in size and made from inert materials like an ordinary mask. In an example embodiment the material is fused silica, which allows the illumination light 102 to pass through it and makes the optical properties on the "chrome" side of the substrate exactly identical to those of a mask. The detector 103 is mounted with its object plane 104 where the chrome film (or equivalent) would be in a real mask. The recorded data is stored in an electronic memory circuit 107 which may be mounted on the substrate and enclosed by the pellicle 105 and pellicle frame 106. In a preferred embodiment a thin glass window replaces the pellicle in order to protect the exposure environment better from out-gassing from the electronics.

Figure 2:
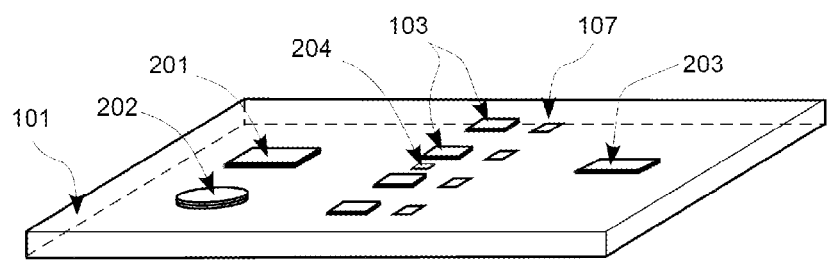
FIG. 2 shows as an example embodiment an apparatus which has the form factor of a normal reticle and can be handled by the reticle handling system.
Figure 3:
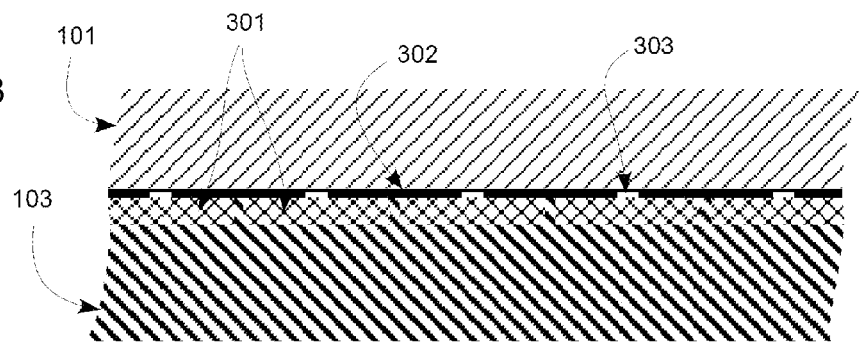
FIG. 3 shows a cross-section of an example embodiment with a photo detector and a light shield with apertures.

FIG. 2 shows the "metrology mask" with the detector side up. Multiple detectors 103 can sample the image in multiple positions and information can be written to one or several memories 107. The electronics operate under control of a processor 201, and are powered by at least one battery 202, e.g. a lithium cell or a rechargeable battery similar to the ones used in cell phones. The battery may be recharged in a non-contact way as is known in the art: by induction, capacitive coupling, or by light energy such as IR radiation.

There is a communication device 203 which can receive and transmit information. The information is preferably transmitted without wires, e.g. by IR or RF. Wireless communication can be used to control the metrology mask while it is measuring, but it may also operate fully asynchronously. Therefore it has a photo-detector, which detects when the slit is passing over the image sensors and synchronizes to the flashes of the laser.

It is known in prior art to measure in-process conditions, in particular temperature, pressure and shear force of a wafer or flat display panel (patents from SensArray (since Summer 2007 KLA-Tencor's SensArray division). Thermal measurements have been described by A. Abdo et al. Wireless matrix measurement of temperature on wafers is known in prior art. (http://www.accurac.com/public/wireless.html.)

The Multi-Channel Detector

The simplest multi-channel detector is an image sensor 103, e.g. a CCD or CMOS sensor, with an array of pixels. These sensors have two issues that must be resolved: the spectral sensitivity and the lateral resolution. The 248 and 192 nm wavelengths that are used in example embodiments do not normally penetrate into the semiconductor, and therefore the sensitivity is very low. This can be resolved by using either a so-called back-thinned silicon sensor, a sensor in a material with higher band gap, e.g. GaN, or most simply by using a fluorescent dye coated on the sensor.

The second issue, the lateral resolution, comes from the fact that most image sensors have a sensitive area 301 that is several microns. The detector channels need to have low internal noise in order to be useful for measurements of non-uniformity and fluctuations. This is equivalent to a large detector area. A pixel size of 5 or preferably 10 microns or larger is desirable. The sampling area in the mask plane needs to be typically 50-200 nm across depending on the technology node where the detector is going to be used. The sensitive pixel area of 5 microns or larger must be restricted to 50-200 nm. In one example embodiment this is done by a projection system, e.g. a 100× magnifying system 501. A 50 nm large area in the mask plane is then imaged onto a 5-micron pixel on the sensor. The image that is recorded contains both the variance of the light and the spatial spectrum of the illumination. However, the projection system with 50 nm resolution and a reasonable number of channels is difficult to make and integrate into a working lithography system.

A different scheme of sampling a small-enough area is to mask most of the areas of the pixels 301 with an opaque layer 302, leaving only a small (e.g. 50 nm) clear area 303. This detector will not record a contiguous image but a sparse matrix of sampled points; therefore it is not possible to calculate a spatial spectrum. However, the intensity statistics are the same and the amount of micro-nonuniformity can be accurately deduced. Since sensors with a million or more pixels are available, one can record a million channels in parallel. With the detector in the mask plane the single-pulse energy density is high; on the other hand, the transmission through sub-half-wavelength holes is very low. One way of increasing the transmission is to use resonant holes, FIG. 4, such as the C aperture 401 that is well known in the literature, see e.g. Xiaolei Shi and Lambertus Hesselink, "Design of a C aperture to achieve $\lambda/10$ resolution and resonant transmission", JOSA B, Vol. 21, Issue 7, pp. 1305-1317).

Figure 4:
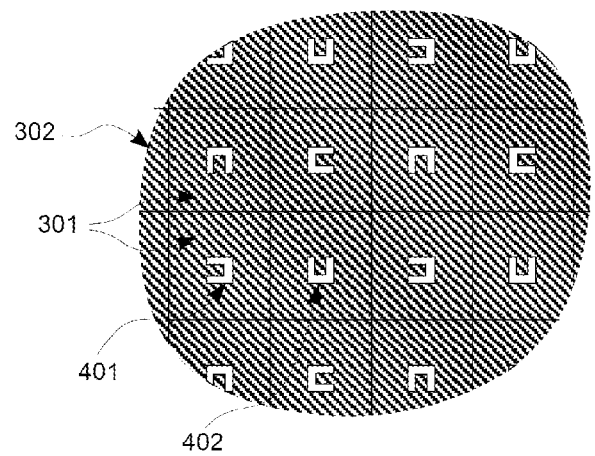
FIG. 4 shows a magnified top view of the example embodiment of FIG. 3, where the apertures are so called C apertures.

The C-shaped opening can augment the transmission by more than two orders of magnitude. Additionally, it can be used as a polarizing filter. C apertures with different orientations 401, 402 sample the polarization of the light differently and the combined recorded intensity can be analyzed as uniformity in each polarization. FIG. 4 shows C apertures rotated to 0, 90, 180, and 270 degrees. Other orientations, e.g. 45, 135, 215 and 315 degrees, may also be used to quantify the polarization along these directions. The C apertures, e.g. 50, 100, nm in size, can be made by electron beam lithography. The mask substrate out of which the metrology mask is made then has an opaque layer, e.g. a chrome film, and said layer is coated with electron beam resist, exposed, developed and the holes are opened by etching. Larger C apertures, e.g. 200 or 400 nm, can be made with optical lithography or by optical direct writing.

Camera Forming a Real Image of the Illumination in the Mask Plane.

Figure 5:
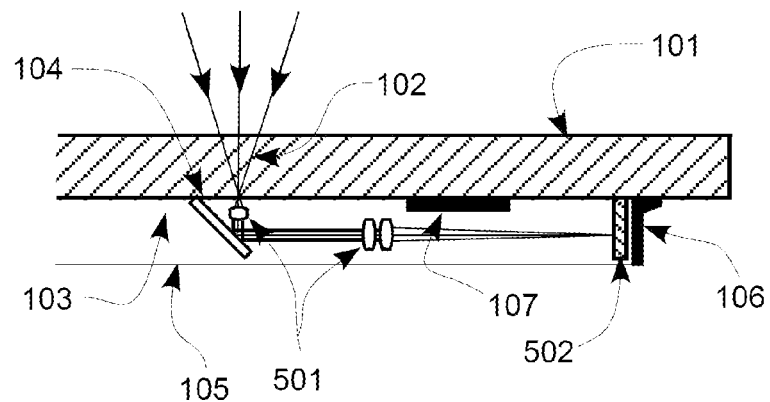
FIG. 5 depicts a camera which forms a real contiguous image of the illumination pattern in a small area of the mask planes.

FIG. 5 shows a camera that forms a real contiguous image of the illumination pattern in a small area of the mask planes.

Figure 6:
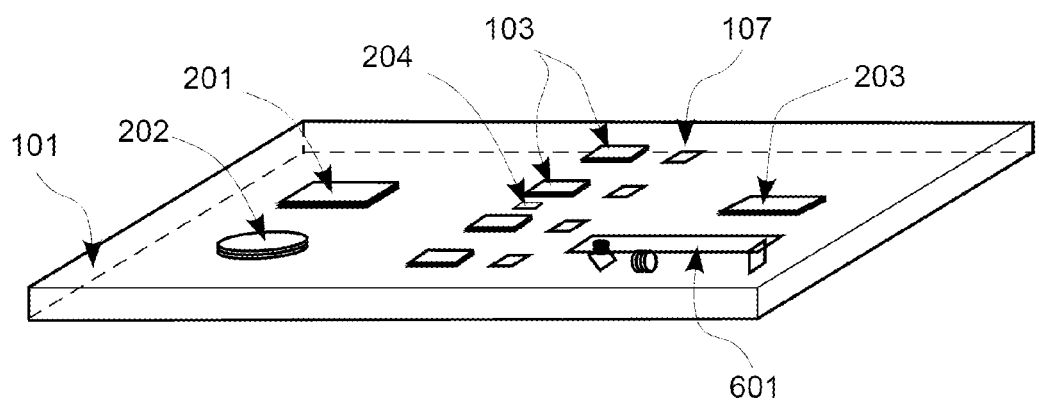
FIG. 6 depicts a metrology mask with one or more camera types.

The camera may have conventional microscope or microscope-like optics 501. In order to fit within the allowed outline of the reticle, the lenses have to be smaller than the lenses normally used in microscopes, more like lenses for endoscopes. The optical quality of smaller lenses is generally easier to achieve, since the shape errors scale but not the wavelength of the light. There may be a lens forming an intermediate image that is then imaged by a second lens on an image sensor 502, or the image on the sensor 502 may be the first projected image after the aerial image in the mask plane as shown in FIG. 5. The digital image or several digital images may be stored in on-mask memory and may be read out later. The real image makes it possible to measure the spatial speckle pattern, thereby confirming theoretical predictions of speckle shape, size and severity. The image can also be used to differentiate between dynamic speckle, which changes between every laser flash, and static speckle or micro-nonuniformity that is repeated. The metrology mask may have a combination (see FIG. 6) of at least one camera as described in FIG. 1 and at least one camera as described in FIG. 5 or just one type of camera. Furthermore, the test mask may be unpatterned or have a test pattern printed on it that can be printed on a wafer or other workpiece. The printed test pattern can be analyzed in terms of CD uniformity and compared to the to the measured non-uniformity of the illumination field. The test mask may be fully self-contained as described above, or have an electronic, wireless or optical coupling to the scanner to be measured. The quantification of the micro-nonuniformities are done in a plane optically equivalent to the pattern plane of the mask, One or several images are recorded using one or several pulse and the images are subsequently processed to extract quantitative information about illumination micro-nonuniformities. In the case of EUV radiation there is no pellicle, otherwise the methods and apparatuses described above apply.

Some Particular Embodiments

The present invention may be practiced as a method or device adapted to practice the method. One embodiment is a method of quantifying micro-nonuniformities and speckle from a laser and an illuminator in a system that projects an image of a mask onto a workpiece. Steppers and scanners are among the systems that use lasers and illuminators for exposure from a mask. The method includes placing at least one camera in a plane optically equivalent to a plane pattern of the mask. In a stepper, illumination passes through the mask, typically through or reflected from a demagnification optical component, and onto a workpiece, such as wafer covered with resist. The image of the mask is transferred by the stepper onto the radiation sensitive surface of the workpiece. The method continues with recording at least one illumination image with the camera using a plurality of laser pulses representative of exposing a workpiece using the mask. In steppers, for instance, ten or one hundred laser pulses may be used cumulatively to transfer the image of the mask onto the radiation sensitive surface. Static micro-nonuniformities may be apparent in one, two, three or four flashes. Dynamic micro-nonuniformities related to the illumination source may similarly be detected after a limited number of flashes. The method continues with processing the illumination image to extract information about illumination non-uniformity.

According one aspect of this method, the workpiece may be a wafer or display panel. Another aspect of this method, which may be combined with the preceding and successive aspects, involves a camera carried on mask stage mechanics. For instance, the camera may be integrated into a metrology reticle that is handled by the system's reticle handler. The camera may communicate wirelessly from the metrology reticle to hardware and software that perform the extraction of information about illumination non-uniformity. Alternatively, the camera may be implemented as an inverted microscope. The inverted microscope may be carried on wafer stage mechanics.

Another aspect of this method is that a nano aperture anyplace in the pattern plane of the mask and a camera positioned behind the aperture. Use of a nano aperture, such as a co-called "C aperture", may enhance sparsely sampled illumination by two orders of magnitude or better.

Another method embodiment quantifies local variations of dose in the exposure system. This method includes providing a multi-channel detector in the mask plane or in an image of the mask plane. The detector uses a sampled area per channel compatible with smallest features in mask scale to the print. The method further includes recording pulse energy integrated on the channels using a small number of flashes. By small number of flashes, we mean less than 10, less than five or even one flash. This is a small number of flashes compared to the number of flashes typically used in a stepper to project a mask image. The method further includes repeating the recording multiple times and calculating variations among the multiple recordings. This method may be applied either to steppers or to scanners. When applied to scanners, the recording may be done both with and without scanning.

This disclosure further includes device embodiments for quantifying micro-nonuniformities and speckle from a laser and an illuminator. One device embodiment includes a metrology reticle incorporating multiple detector channels with a sampled area per channel compatible with smallest features in scale found on a corresponding pattern reticle. One feature of this embodiment further includes a wireless communication channel adapted to transmit sample data from the metrology reticle to a receiver. Another aspect, which may be combined with the preceding or successive aspects, includes a nano aperture at a pattern plane of the metrology reticle. The aperture is positioned between an illumination source and the multiple detector channels. This nano aperture may be a so-called "C aperture".

The device of this first embodiment may be incorporated in either a stepper or a scanner. In a stepper, it would be carried by a reticle carrier. In a scanner, it would be positioned in place of the mask that otherwise would be projected by the scanner.

Another device embodiment for quantifying micro-non-uniformities and speckle from a laser and an illuminator includes an inverted microscope carried on workpiece stage mechanics. One or more detector channels, with a sampled area per channel compatible with smallest features in scale found on a corresponding pattern reticle, are positioned in an image plane of the inverted microscope to detect micro-non-uniformities.

Either of the device embodiments may be incorporated in a stepper or scanner that includes a controller and processing logic adapted to sample the detector channels after less than 10, less than five or just one laser flash.

I claim:

1. A method for quantifying illumination micro-nonuniformities in an exposure system for exposing from a mask, including:
   providing at least one multi-channel detector in a plane optically equivalent to a pattern plane of said mask,
   recording at least one illumination image with said at least one detector in said plane optically equivalent to a pattern plane of said mask, and
   processing the illumination image to extract information about illumination micro-nonuniformity.

2. The method of claim 1, wherein said at least one detector is at least one camera.

3. The method of claim 2, wherein said exposure system comprises at least one laser as light source.

4. The method of claim 3, wherein said recording is performed by using a plurality of laser pulses representative of exposing a workpiece using the mask.

5. The method of claim 3, wherein said illumination image is recorded using 5 or less laser flashes.

6. The method of claim 5, wherein said number of flashes per recording is 1.

7. The method of claim 2, wherein said at least one camera is carried on mask stage mechanics.

8. The method of claim 2, wherein said at least one camera is implemented as an inverted microscope.

9. The method of claim 8, wherein the inverted microscope is carried on workpiece stage mechanics.

10. The method of claim 2, wherein said at least one camera is integrated into a metrology reticle that is handled by the system's reticle handler.

11. The method of claim 10, wherein said at least one camera communicates wirelessly with hardware and software that perform the extraction of information about illumination non-uniformity.

12. The method of claim 2, further including interposing a nano aperture at the pattern plane of the mask and positioning the at least one camera behind the aperture.

13. The method of claim 12, wherein the nano aperture is a so-called C aperture.

14. The method of claim 13, wherein said C aperture is used to increase the transmission.

15. The method of claim 14, wherein said C aperture is a polarizing filter used to characterise the properties of the recorded illumination image.

16. The method of claim 2, wherein the at least one detector is a multichannel detector in the mask plane, or an image of the mask plane, with a sampled area per channel having a size of magnitude compatible with or smaller than the smallest features in the mask scale to be printed.

17. The method of claim 16, wherein said recording is detecting the pulse energy integrated on said channels from a small number of laser flashes.

18. The method of claim 17, including:
   repeating said recording multiple times; and
   calculating variations from said multiple recordings.

19. The method of claim 18, wherein the channels are calibrated by comparison of long-term averages in that detector noise and pulse-to-pulse average energy are removed from the variance.

20. The method of claim 1, wherein the workpiece is one of a wafer or display panel.

21. The method of claim 1, wherein said exposure system is a scanner and the recording is done both with and without scanning.

22. A device for quantifying micro-nonuniformities from laser illumination, the device having a light sensor with a lateral resolution compatible with the dimensions of the micro-nonuniformities, wherein said device is designed to be inserted into an exposure system in place of a reticle.

23. The device of claim 22, wherein the device is a metrology reticle incorporating multiple detector channels with a sampled area per channel compatible with the smallest features in scale found on a corresponding pattern reticle.

24. The device of claim 22, wherein said sensor is a camera with magnifying optics.

25. The device of claim 22, further including a wireless communication channel adapted to transmit sample data from the metrology reticle to a receiver.

26. The device of claim 22, further including a nano aperture at the pattern plane of the metrology reticle, positioned between an illumination source and the multiple detector channels.

27. The device of claim 26, wherein the nano aperture is a so-called C aperture.

28. A stepper including a reticle carrier, with the device of claim 22 carried on the reticle carrier.

29. A scanner including the device of claim 22.

* * * * *